Nov. 26, 1968 F. F. PELLETIER 3,412,619

RADIO RECEIVER PUSHBUTTON TUNER

Filed March 1, 1967 2 Sheets-Sheet 1

FERNAND F. PELLETIER
INVENTOR

BY Bruce L. Lamb

ATTORNEY

RADIO RECEIVER PUSHBUTTON TUNER

Filed March 1, 1967 2 Sheets-Sheet 2

FERNAND F. PELLETIER
INVENTOR

BY [signature]

ATTORNEY

United States Patent Office 3,412,619

Patented Nov. 26, 1968

3,412,619
RADIO RECEIVER PUSHBUTTON TUNER

Fernand F. Pelletier, Baltimore, Md., assignor to The Bendix Corporation, Baltimore, Md., a corporation of Delaware Filed Mar. 1, 1967, Ser. No. 619,742
5 Claims. (Cl. 74—10.33)

ABSTRACT OF THE DISCLOSURE

A radio receiver tuner with turnover pushbutton capable of being set up on two separate stations for each pushbutton, one of which stations may be on the AM broadcast band and the other station on the FM broadcast band. Dual tuning slides are associated with each pushbutton, one on each side of its pushbutton. A tab on the pushbutton engages a slot in one or the other of the slides, depending on the rotational position of the pushbutton, causing the slide so engaged to be activated when the bushbutton is depressed.

*Background of the invention*

The development of the pushbutton tuner in the automotive radio field met with almost unqualified approval due to the ease with which the individual pushbuttons could be set up, the ease and speed with which the radio receiver could be tuned to the various stations set up on the pushbuttons, and the safety inherent in being able to locate familiar stations without having to search through the broadcast band. When the tuner is used in a radio receiver covering a single broadcast band, such as the AM broadcast band, a different AM station can be set up on each pushbutton allowing as many stations to be selected by pushbutton as there are pushbuttons provided on the tuner.

When used in a dual broadcast band radio receiver, such as an AM/FM receiver, the tuner is provided with a band switch which may be operated either manually or through a cam-follower actuated by a cam which is an integral part of the pushbutton. The cam is in the form of a tab which serves to force the cam-follower and hence the switch either into an AM or FM position depending on the location of the tab and the shape of the cam-follower. Using this type of tuner, certain pushbuttons have tabs so positioned so as to switch the receiver into an AM mode of operation, and the other pushbuttons have tabs so positioned so as to switch the receiver into an FM mode. AM stations are set up on the AM pushbuttons and FM stations are set up on the FM pushbuttons. If the receiver band switch is in the FM mode and an AM pushbutton on which an AM station was set up is depressed, the pushbutton tab automatically forces the cam-follower to move the band switch to the AM position while tuning the receiver to the selected AM station. It will be noted that using this type of tuner, a different station may be set up on each pushbutton but the decision as to which and how many pushbuttons can be set up on FM stations and which pushbuttons can be set up on AM stations is made by the tuner designer.

The limitations of the last mentioned tuner system will be realized when the tastes of the various listeners are considered along with the different geographical locations in which the receiver will be used. One listener whose tastes run to the type of programming normally found on the FM broadcast band may find that the tuner designer has not chosen to provide enough FM pushbuttons, while another listener may desire more AM pushbuttons. The next development of the receiver pushbutton tuner was therefore the development of the so-called turnover pushbutton which allowed the listener to set up any combination of FM and AM stations, from all FM stations to all AM stations, on the pushbuttons. The turnover pushbutton is rotatable continuously about its longitudinal axis and is detented at 180° intervals. Dual tabs in the nature of cams are provided on the pushbutton on diametrically opposite surfaces, one tab being so positioned to switch the receiver into the AM mode of operation, and the other tab being so positioned, when the pushbutton has been rotated 180°, to switch the receiver into the FM mode. As in the other tuner systems previously discussed, one station is set up on each pushbutton. The listener was now free to set up any combination of AM and FM stations on his tuner limited only by the total number of pushbuttons on the tuner. However, if a pushbutton has been set up on a station in one band, for example, the FM band and then the pushbutton is turned over and depressed, the tab on the pushbutton will cause the receiver to switch to the other band, AM. The pushbutton, additionally, moves the tuner elements to a position which corresponds to the FM station set up on that button, but since the receiver is in the AM mode, there is no station corresponding to that position of tuner elements, so that no station is received for that combination.

The tuners aforementioned are well known in the art. Briefly, this type of tuner includes a number of tuning slides or actuators, usually five, each having a pushbutton fixedly or rotatively mounted on one end and a resettable cam segment articulately mounted on the other end. If the cam segment is clamped to the tuning slide and a pushbutton is depressed, its tuning slide and cam segment move toward, and the cam segment abuts a tilt bar structure which tilts to conform with the set position of the abutting cam segment. The tilt bar structure, through a system of linkages, positions a slidable carriage carrying tuning slugs so as to position the tuning slugs in their various stationary coil tuning units. The tilt angle to which the tilt bar structure will rotate depends on the set position of the cam segment. A locking mechanism on the tuning slide normally clamps the cam segment in the set position. The cam segment can be reset by exerting an outward force on the pushbutton which unlocks the segment. When the pushbutton is depressed with the segment locked, the tilt bar structure will conform to the segment's preset position. Now, however, if the pushbutton is depressed with the segment unlocked, the segment will conform with the preset position of the tilt bar structure. Additionally, the segment is relocked when the pushbutton is depressed. Therefore, to reset the particular pushbutton, the segment is unlocked and the radio manually tuned to a desired station. This will rotate the tilt bar structure to an angle corresponding to the tuned station. The pushbutton is then depressed, causing the segment to conform to this tilt bar structure angle and simultaneously locking it at this angle. Subsequent activations of this pushbutton will cause the tilt bar structure to realign itself to the preset segment angle, hence tuning the radio to the station preset on that pushbutton.

Where the tuner is to be used in an automotive radio receiver the minimum cross-sectional area of a pushbutton must be determined, in a human engineering sense, by considering the size pushbutton which can be conveniently manipulated by the gloved hand of an operator. The cross-sectional area of the tuning slide has no such human limitations to be considered. In short, the best pushbutton should be as wide as possible with generous separation between pushbuttons, consistent with space limitations, while the tuning slide can be made narrow.

*Summary of the invention*

Accordingly, in the embodiment of the instant invention, two tuning slides have been provided for each turnover pushbutton, one on each side of its associated pushbutton. Additionally, a third tab has been added to each pushbutton. Each tuning slide is provided with a transverse slot. The added tab on the pushbutton engages either one or the other of the slide slots depending on the rotational orientation of the pushbutton. An AM station can be set up on the tuning slide engaged by the third tab when the pushbutton is rotated into the AM position. An FM station can be set up on the other tuning slide which is engaged by the third tab when the pushbutton is rotated into the FM position. This allows the listener to set up two stations for each tuner pushbutton provided, one of which is on the AM broadcast band and the other on the FM band.

*Description of the preferred embodiment*

Figure 1:
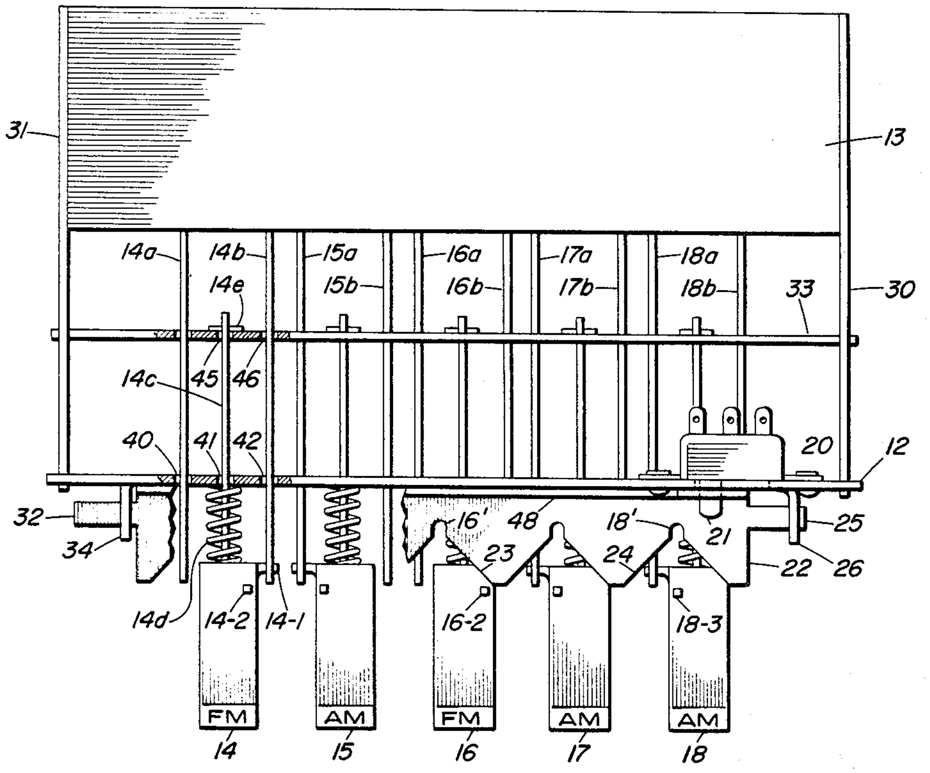
FIG. 1 is a plan view of a tuner constructed in accordance with this invention.

FIG. 1 shows a plan view of a tuner constructed in accordance with this invention including a front mounting panel 12 for mounting the tuner to the escutcheon of a radio or the like. A tuning mechanism 13 is actuated by one of the tuning slides **14*a*, 14*b*, 15*a*, 15*b*, 16*a* 16*b*, 17*a*, 17*b*, 18*a* or 18*b* as chosen by depressing the proper pushbutton when that pushbutton has been rotated into the proper position as will be fully explained below. The details of the tuning mechanism 13** have been omitted for clarity and brevity. Tuning mechanisms of the type contemplated for use with this invention are well known in the art and have previously been discussed. Briefly, they include a resettable articulated cam segment mounted on each tuning slide which abuts and positions a rotatable tilt bar structure when the tuning slide is depressed. The tilt bar structure linearly positions a slidable carriage carrying a plurality of tuning slugs so as to position the tuning slugs in their various stationary coil tuning units. In the present embodiment of the invention, certain of these tuning coil and slug combinations would be predesignated for AM operation and others for FM operation. Tuning mechanisms of this type have been taught by the patent to H. J. McGarvey, Patent No. 2,267,474, issued Dec. 23, 1941, with improvements to the aforementioned resettable cam segment mounted on the tuning slide as taught by the patent to E. H. Allen, 2,659,236, issued Nov. 17, 1953.

It will be noted that the tuner illustrated in the various drawings includes five pushbuttons. The exact number of pushbuttons which can be used with this invention is, of course, arbitrary and any discussion of the structure or operation of one pushbutton and its related cooperating parts is relevant to all pushbuttons. Bar **14*c* is free to slide linearly toward tuner mechanism 13 in slots 41 and 45 located in panels 12 and 33 respectively when urged rearward by a force applied on pushbutton 14 mounted thereon. A tab 14–1 which is integral with pushbutton 14 has engaged a slot in tuning slide 14*b*. As pushbutton 14 moves rearward, tab 14–1 carries tuning slide 14*b*, which is supported by slots 42 and 46, with it, actuating the tuning mechanism. Pushbutton 14 with its cooperating tuning slide 14*b* and bar 14*c* are returned to the starting position shown by spring 14*d* upon removal of the pushbutton rearward motion producing force. Bar 14*c* and pushbutton 14 are restrained in the forward direction by pin 14*e*, driven into bar 14*c*, abutting panel 33**.

Figure 2:
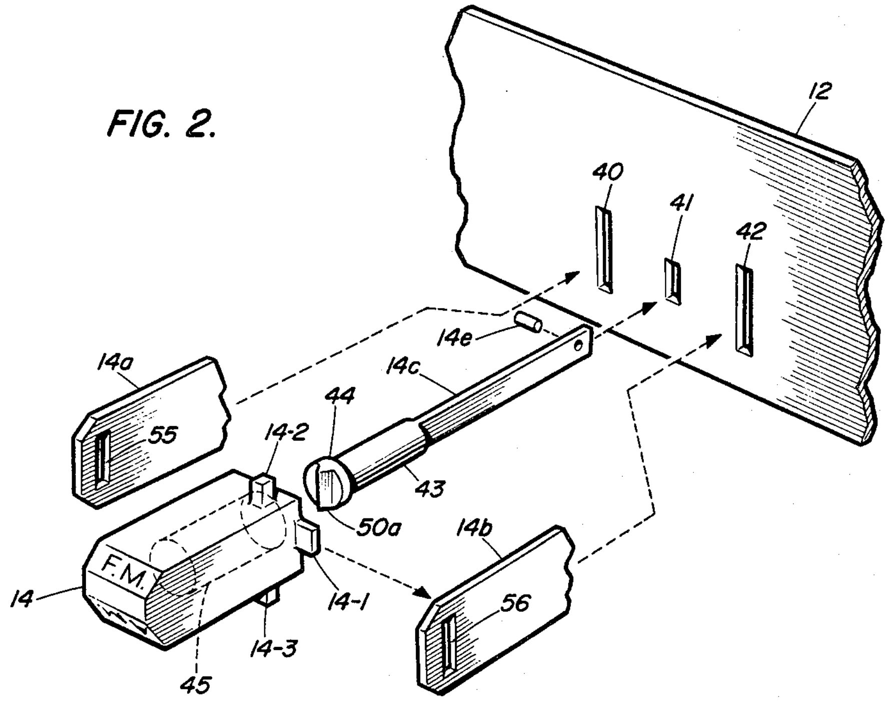
FIG. 2 is an exploded view showing the cooperation of the pushbutton and dual slides.

Referring to FIG. 2, bar **14*c* is seen to have a cylindrical section 43 and an enlarged cylindrical section 44 which is slidably fitted into cylindrical pushbutton hole 45. Tuning slide 14*b* has slot 56 which pushbutton tab 14–1 engages. Pushbutton 14 is rotatable about bar 14*c*** into two stable positions, one such position being that as shown in FIG. 2 with the pushbutton legend "FM" up so that tab

14–1 is to the right engaging slide **14*b*, and the other position being with legend "AM" up so that tab 14–1 is to the left engaging slide 14*a*. Before leaving FIG. 2 note the protuberance 50*a* on the flat position of cylindrical section 44**.

Figure 4:
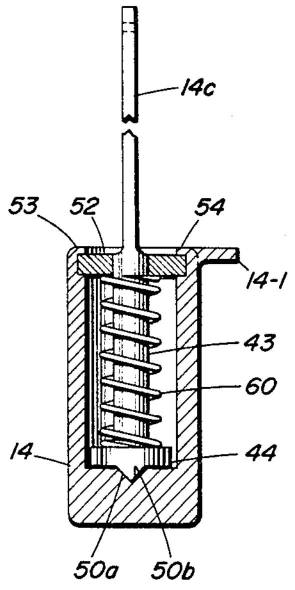
FIG. 4 is a section taken through the longitudinal axis of a pushbutton showing the turnover features.

Referring to FIG. 4, protuberance **50*a* is shown detented by spring 60 into pushbutton detent groove 50*b* thus providing the first of the aforesaid pushbutton rotationally stable positions. Tab 14–1 is seen to be toward the right. Spring 60 is constrained within pushbutton 14 by bushing 52 slidably fitted to cylindrical section 43 and staked into pushbutton 14 by staking tangs 53 and 54. Since the detent surfaces 50*a* and 50*b* are symmetrical about the vertical axis of cylindrical section 44, pushbutton 14 may be easily moved into its second rotationally stable position by simply rotating it one-half turn. In this second position tab 14–1** will be toward the left.

Figure 3:
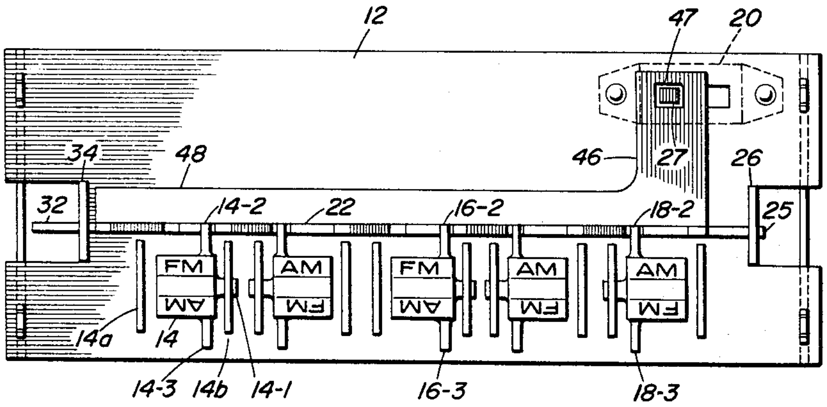
FIG. 3 is a front view of a tuner.

Referring to FIGS. 3 and 1, a switch 20 which is used to switch the radio receiver from AM to FM mode of operation and vice versa, is fastened to panel 12. A sheet metal cam-follower 22 has end positions 25 and 32 slidably restrained in slots disposed in flaps 26 and 34 respectively, turned out from panel 12. Cam-follower 22 additionally includes stiffening section 48 and extension 46 in which is pierced hole 47 which engages sliding switch button 27. Pushbutton 14 has extended cam surfaces 14–2 and 14–3 located asymmetrically with respect to the pushbutton vertical axis. Cam surfaces 14–2 and 14–3 can be seen in greater detail in FIG. 2. In like manner, pushbutton 16 has cam surfaces 16–2 and 16–3 and pushbutton 18 has cam surfaces 18–2 and 18–3. It will be noted that with a pushbutton rotated so that the legend "FM" is up, the cam surfaces are to the right of the pushbutton vertical centerline and with a pushbutton rotated so that the legend "AM" is up, the cam surfaces are to the left of the pushbutton vertical centerline. Referring particularly to FIG. 1, cam follower 22 is seen to include cut-out portions 16′ and 18′ and cam follower surfaces 23 and 24. If pushbutton 16 is depressed, cam 16–2 will engage cam-follower 22 at surface 23, forcing cam-follower 22 to the right carrying with it switch button 27 causing switch 20 to move to a new position. If, however, pushbutton 18 is first depressed, cam 18–3 will move into cut-out portion 18′ and cam follower 22 and switch 20 will remain in the state illustrated. If pushbutton 18 is depressed after the depression of pushbutton 16 has caused cam-follower 22 to move to the right, cam 18–3 will engage cam-follower 22 at surface 24 causing the cam-follower to shift to the left into the position illustrated. It therefore becomes apparent that because of the asymmetrical location of the cams, the depression of any pushbutton having the legend "AM" turned up will cause cam follower 22 to move to the left if it was previously to the right, or remain at the left if it was already at the left, and the depression of any pushbutton having the legend "FM" turned up will cause cam follower 22 to move or remain to the right depending upon its previous position.

The foregoing discussion has shown how each pushbutton in a tuner can be made to select two different stations, and if the receiver operates on two different broadcast bands, how the proper band is automatically selected.

The invention claimed is:

1. In a pushbutton tuner including a tuning means and plurality of pushbuttons having multiple rotationally selectable stable positions, an improvement comprising, a plurality of tuning means actuators associated with each pushbutton, one said actuator for each said rotationally stable pushbutton position, and means disposed on each said pushbutton releasably engaging a different said actuator in each said rotationally stable pushbutton position.

2. A pushbutton tuner as claimed in claim 1 for radio receivers operable in AM and FM modes having additionally a switching means for selecting said receiver mode, multiple cam surfaces disposed on said pushbuttons, and
a bistable cam follower cooperating with said cam surfaces to actuate said switching means.

3. A pushbutton tuner as claimed in claim 2 wherein, said actuator engaging means comprises a tab disposed on said pushbutton, and
each said actuator contains a slot releasably engaged by said tab.

4. A pushbutton tuner as claimed in claim 3 wherein each said pushbutton has two rotationally stable positions.

5. In a pushbutton tuner for radio receivers operable in either an AM or FM mode of operation, including a switching means for selecting receiver operation mode, tuning means, a plurality of pushbuttons having selectable first and second positions, each said pushbutton having dual cam surfaces, and a bistable cam follower cooperating with said dual cam surfaces to actuate said switching means, the improvement comprising,
a tab on each said pushbutton, and a plurality of tuning slides for actuating said tuning means consisting of first and second tuning slides associated with each said pushbutton and so arranged that said tab engages said first tuning slide when said pushbutton is in said first position, and said tab engages said second tuning slide when said pushbutton is in said second position.

References Cited

UNITED STATES PATENTS

| | | | |
|---|---|---|---|
| 2,356,935 | 8/1944 | Koch | 74—27 X |
| 3,212,343 | 10/1965 | Clark | 74—10.37 |
| 3,247,728 | 4/1966 | Wolf et al. | 74—10.37 |

MILTON KAUFMAN, *Primary Examiner.*